United States Patent [19]

Jason

[11] Patent Number: 4,574,251

[45] Date of Patent: Mar. 4, 1986

[54] LOGARITHMIC DIGITALLY VARIABLE GAIN CONTROLLED AMPLIFIER

[75] Inventor: Barry L. Jason, Bedford, Tex.

[73] Assignee: Motorola, Inc., Schaumburg, Ill.

[21] Appl. No.: 656,821

[22] Filed: Oct. 1, 1984

[51] Int. Cl.⁴ .......................... H03G 3/20; G06G 7/24
[52] U.S. Cl. ...................................... 330/279; 328/145
[58] Field of Search ............... 330/254, 284, 278, 279; 328/145; 364/857

[56] References Cited

U.S. PATENT DOCUMENTS

| | | | |
|---|---|---|---|
| 2,781,967 | 2/1957 | Spencer et al. | 364/857 |
| 3,488,484 | 1/1970 | Royer | 364/857 |
| 3,653,033 | 3/1972 | Bonami et al. | 364/857 |
| 3,736,515 | 5/1973 | Kadron et al. | 328/143 |
| 3,757,234 | 9/1973 | Ohlson | 328/142 |
| 3,811,088 | 5/1974 | Hekimian | 328/145 |
| 3,878,383 | 4/1975 | Uchida | 328/145 |
| 4,143,363 | 3/1979 | Dotter, Jr. | 340/347 AD |
| 4,300,203 | 11/1981 | Brown | 364/577 |
| 4,349,755 | 9/1982 | Bee | 328/145 |
| 4,413,235 | 11/1983 | Jason | 330/254 |

OTHER PUBLICATIONS

IEEE Journal of Solid-State Circuits, vol. SC-16, No. 6, Dec. 1981, Article entitled "A Volume and Tone Control IC for Hi-Fi Audio" by Maki Sato, Kazuo Suzuki, Tadao Suzuki, and Kinya Akutsu, pp. 682-689.

Primary Examiner—James B. Mullins
Assistant Examiner—G. Wan
Attorney, Agent, or Firm—Thomas G. Berry; Donald B. Southard

[57] ABSTRACT

An integratable amplifier circuit is provided including a current generator section, a digital control section and a variable gain amplifier section. The integratable amplifier circuit is compatible with the bipolar process and can be included on an integrated circuit, such as one performing receiver and audio functions. The current generator section produces a biasing current which is applied to a digital control section which divides the biasing current according to a binary input signal to produce a control current equal to a predetermined fraction of the biasing current, corresponding to a predetermined logarithmic attenuation. The control current is applied to a control input of the variable gain amplifier section to vary the gain thereof in logarithmic steps.

7 Claims, 4 Drawing Figures

CURRENT GENERATOR SECTION

Fig. 1a

CURRENT GENERATOR SECTION

DIGITAL CONTROL SECTION

*Fig. 1d*

LOGARITHMIC DIGITALLY VARIABLE GAIN CONTROLLED AMPLIFIER

BACKGROUND OF THE INVENTION

This invention relates generally to integratable amplifier circuits having variable gain control, and more particularly, to an integratable amplifier circuit susceptible to fabrication in a monolithic, bipolar integrated circuit form in which logarithmic gain control over a wide gain range may be effectively provided.

Logarithmic, digitally variable gain controlled amplifiers are known in the art. Such conventional amplifiers often employ linear digital to analog converters (DAC) to generate the logarithmic function by piece-wise linear approximation. When using the linear DAC the maximum attenuation obtainable is related to the number of bits employed in the digital input. For example, for a 4 bit linear DAC the maximum attenuation is $1/(2^4)$ = TM = $-24.1$ dB. Accordingly, a 16 bit linear DAC is required to provide an attenuation of $-96.3$ dB = $1/65,536$ ($2^{16}$ = 65,536). Thus, an undesirably large number of bits is required to achieve a wide attenuation range employing the known linear DAC.

Logarithmic, digitally variable gain controlled amplifiers have been utilized for volume control over a large dynamic range. A paper in the *IEEE Journal of Solid-State Circuits,* Vol. SC-16, No. 6, December 1981, pages 682–689 entitled "A Volume and Tone Control IC for Hi-Fi Audio" describes a digital volume control circuit fabricated as a monolithic integrated circuit employing a metal-oxide semiconductor (MOS) process. Such MOS process is not compatible with other receiver and audio functions that have been integrated utilizing a bipolar process.

SUMMARY OF THE INVENTION

Accordingly, it is an object of the invention to provide an integratable amplifier circuit susceptible to fabrication in a monolithic, bipolar integrated circuit form with logarithmic gain control.

It is another object of the invention to provide the logarithmic gain control directly according to a binary input signal such that a wide range of attenuation is achievable for a minimized number of bits employed in the binary input signal.

It is a further object of the invention to provide a method of providing logarithmic, digitally variable gain control in an integratable variable gain controlled amplifier circuit that has a gain proportional to a control current being applied to a control input thereof.

In practicing the invention, an integratable, variable gain controlled amplifier circuit is provided which comprises an amplifier having a signal input, a control input and an output and having a gain that is proportional to a control current being applied to the control input. In addition, the gain controlled amplifier circuit includes a current generator for providing a biasing current; control means coupled to the current generator for dividing the biasing current according to a binary input signal to produce a control current equalling a predetermined fraction of the biasing current that corresponds to a predetermined logarithmic attenuation; and means for applying the control current to the control input, thereby providing the predetermined logarithmic attenuation in the amplifier.

Briefly, in accordance with the method of the present invention, a binary input signal is provided that relates to a desired logarithmic attenuation according to a predetermined rule. A biasing current is provided and is sequentially divided by a series of preselected fractions according to said binary input signal to produce a control current equalling a predetermined fraction of the biasing current. The control current is applied to a control input of the variable gain controlled amplifier circuit to provide the predetermined logarithmic attenuation therein

DETAILED DESCRIPTION OF THE PREFERRED EMBODIMENT

Figure 1A:
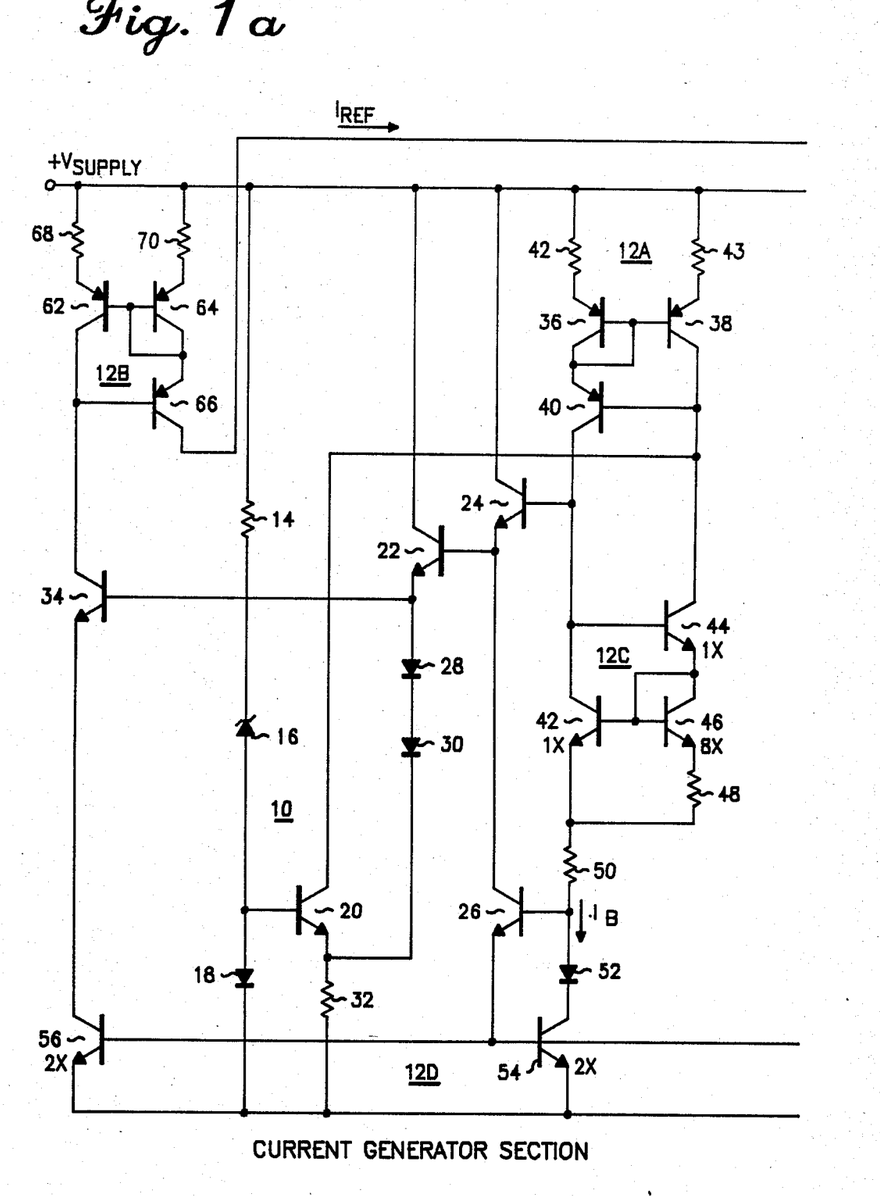
FIG. 1a is a schematic diagram of a current generator section of the novel logarithmic, digitally variable gain controlled amplifier according to the invention.

Referring to FIG. 1a, there is shown a schematic diagram of a current generator section of a preferred embodiment of the logarithmic, digitally variable gain controlled amplifier constructed in accordance with the invention.

The current generator section comprises start-up and biasing circuitry 10, a plurality of PNP transistor current mirrors 12A, 12B, an NPN transistor current mirror 12C and an NPN transistor current source 12D. The current generator section is constructed in accordance with conventional integrated circuit (IC) technique in order to generate a biasing current, shown in FIG. 1a as $I_B$, that is proportional to the absolute temperature. The temperature dependence of the biasing current $I_B$ is utilized to temperature stabilize the variable gain amplifier section that will be described hereinafter.

The start-up and biasing circuitry 10 includes resistors 14 and 32, a zener diode 16, a diode 18, a plurality of NPN transistors 20, 22, 24 and diodes 28, 30. The function of the circuitry 10 is to develop a bias for the base of a transistor 34 and to produce a start-up current for the current mirror 12A.

The series-connected resistor 14, zener diode 16 and diode 18 are coupled between the positive voltage supply terminal, $+V_{supply}$ and ground, as shown, to provide a start-up current in the collector of transistor 20. The base of the transistor 20 is coupled to the anode of both zener diode 16 and diode 18, and the emitter thereof is coupled through a resistor 32 to ground. The collector of transistor 20 is coupled to an input of current mirror 12A, as shown, so that this current mirror receives and "mirrors" the start-up current.

The collectors of the start-up transistors 22, 24 are coupled to the positive voltage supply terminal, $+V_{supply}$. The base of transistor 24 is coupled to an output of the PNP transistor current mirror 12A and the emitter thereof is coupled to both the base of the transistor 22 and to the collector of an NPN transistor 26. The emitter of transistor 22 is coupled through the series-connected diodes 28, 30 and resistor 32 to ground, as shown. In addition, the emitter of the start-up transistor 22 is coupled to the base of a transistor 34 to provide a bias voltage therefor. The collector of transistor 34 is coupled to an input of the PNP transistor current mirror 12B and the emitter thereof is coupled to an output of current source 12D.

The biasing current $I_B$ is generated by the cooperative operation of the PNP transistor current mirror 12A and the NPN transistor current mirror 12C. The transistor current mirror 12A comprises a plurality of PNP transistors 36, 38, 40. The emitters of transistors 36, 38 are coupled through resistors 42, 43, respectively, to the positive voltage supply terminal, $+V_{supply}$. The base of transistor 36 is coupled to the base of transistor 38, with the base of transistor 36 shorted to its collector in the conventional manner. The emitter of transistor 40 is coupled to the shorted base and collector of transistor 36 with the base thereof coupled to the collector of transistor 38, as shown.

With the foregoing arrangement, the collector current of transistor 38 equals the collector current of transistor 40 according to the operation of conventional current mirrors. The collectors of transistors 38, 40 are coupled to the start-up circuitry 10 as described hereinbefore and to the current mirror 12C, as shown.

The NPN transistor current mirror 12C comprises a plurality of NPN transistors 42, 44, 46. The collectors of the transistors 42, 44 are coupled to the collectors of the transistors 40, 38, respectively. The base of transistor 42 is coupled to the base of transistor 46 with the base of transistor 46 shorted to its collector in the conventional manner. The emitter of transistor 44 is coupled to the shorted base and collector of transistor 46. The base of transistor 44 is coupled to the collector of transistor 42, as shown. With this arrangement, and particularly with the illustrated combination of mirrors 12A and 12C, the output emitter currents of the transistors 42, 46 are equal.

The transistor 46 is provided with an emitter having a junction area (8×) equal to eight times the junction area (1×) of the emitter of the transistor 42. This increase in the emitter junction area of transistor 46 results in a proportional decrease in the base emitter voltage of the transistor 46 for a given current flow. Thus, the base emitter voltage VBE 46 of the transistor 46 is less than the base emitter voltage VBE 42 of the transistor 42 with the emitter current of the same being equal. A resistor 48 is coupled between the emitter of the transistors 42, 46, so that the voltage difference between the base emitter voltage of the transistors 42, 46 appears across the resistor 48.

The value of the resistor 48 (R48) is selected to determine the desired magnitude of the biasing current, $I_B$, that is defined as follows by the equation:

$$I_B = 2 (VBE\ 42 - VBE\ 46)/R48$$

where $I_B$ is expressed in amperes, VBE 42 and VBE 46 are expressed in volts and R48 is expressed in ohms.

In addition, the emitter of transistor 42 is coupled to a biasing resistor 50, as shown. The output of the NPN transistor current mirror 12C is coupled via the resistor 50 to the anode of a diode 52. The cathode of the diode 52 is coupled to the collector of an NPN transistor 54 that is included in the NPN transistor current source 12D. The base of the NPN transistor 26 is coupled to the anode of the diode 52 and the emitter thereof is coupled to the base of the NPN transistor 54, as shown. Diode 52 is employed to provide a voltage which matches the base emitter voltage of the NPN transistor 26 so that the collector-base voltage of transistor 54 is held at or near zero. The reason for selecting this collector-base voltage for transistor 54 is because the bias and operating characteristics of transistor 54 will match the bias and operating characteristics of transistors 58 and 60 (FIG. 1b) and allow the currents of those three transistors to match each other according to the ratios of their base-emitter junction areas.

Figure 1B:
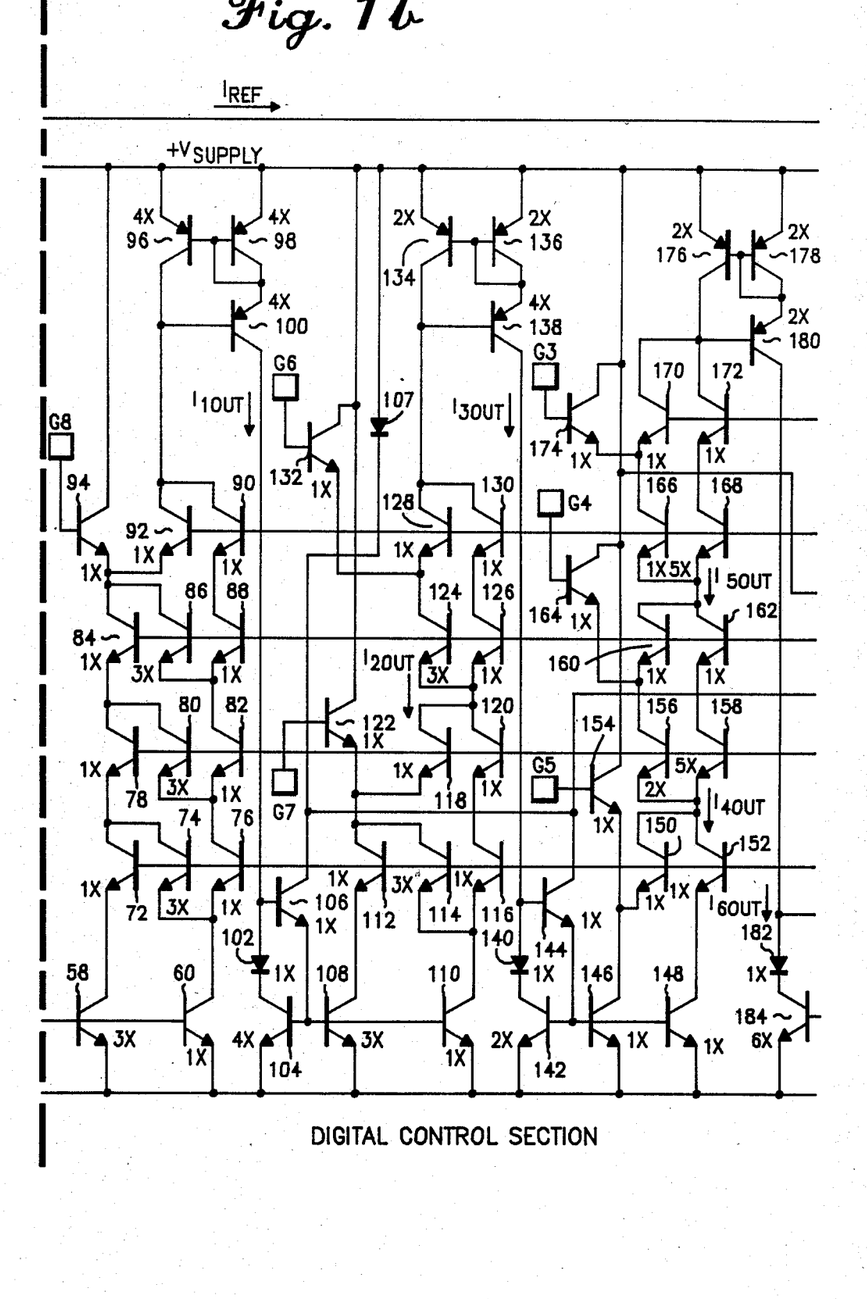
FIG. 1b is a schematic diagram of a first portion of a digital control section of the novel logarithmic, digitally variable gain controlled amplifier.

The NPN current source 12D additionally includes NPN transistors 56, 58, 60, with transistors 58, 60 shown in FIG. 1b. The base of the NPN transistor 54 is coupled to the bases of the transistors 56, (58), (60). The emitters of the transistors 54, 56, (58), (60) are grounded; accordingly, the magnitude of the base emitter voltages are equal for the transistors 54, 56, (58), and (60). The emitter currents of the transistors 54, 56, (58), and (60) are substantially equal to their respective collector currents.

The emitter of each of the transistors 54, 56, (58), (60) is provided with a selected junction area in order to determine the emitter current of the same. For example, transistors 54, 56 are shown as having twice the emitter junction area (2×) as the emitter junction area (1×) of transistor (60), with transistor (58) shown as having three times the emitter junction area (3×) as transistor (60). Accordingly, the emitter current of both transistors 54, 56 equals the biasing current, $I_B$. The emitter current of transistor (58) equals the biasing current $I_B$ times the ratio 3×/2× or 3/2 $I_B$. The emitter current of transistor (60) equals the biasing current $I_B$ times the ratio 1×/2× or $\frac{1}{2}I_B$. Thus, the input current $I_1$ that is applied (via the collectors of transistors 58 and 60) to the digital control section, shown in FIGS. 1b, 1c, equals the sum of the collector currents 3/2 $I_B$, $\frac{1}{2}I_B$ of transistors 58, 60 (FIG. 1b) or twice IB. Because the junction area of the transistor 58 is three times larger than the junction area of the transistor 60, the current supplied by the transistor 58 corresponds to $\frac{3}{4}I_1$, and the current supplied by the transistor 60 corresponds to $\frac{1}{4}I_1$. Those two currents (whose sum $I_1$ equals $2I_b$) are progressively divided in the digital control section to produce a control current that is utilized to obtain a desired logarithmic attenuation in a variable gain amplifier section, shown in FIG. 1d, as will be described later herein.

Returning briefly to FIG. 1a, the PNP transistor current mirror 12B comprises a plurality of PNP transistors 62, 64, 66 interconnected as shown with resistors 68 and 70 in the usual manner. In operation, the mirror 12B receives a current from the collector of the transistor 34 and mirrors that current as $I_{REF}$ to the variable gain amplifier section that will be described later herein.

Figure 1C:
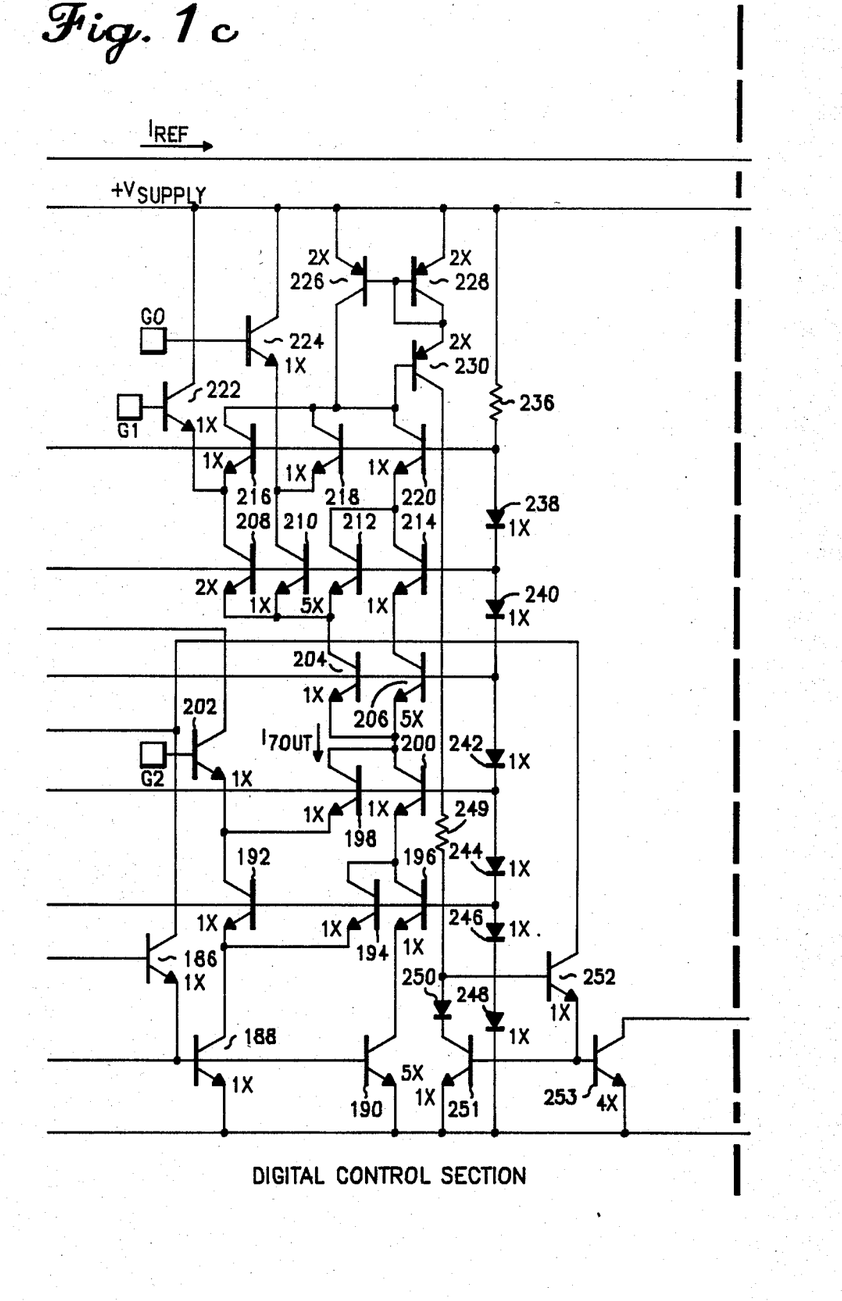
FIG. 1c is a schematic diagram of a remaining portion of the digital control section of FIG. 1b.

Referring now to FIGS. 1b, 1c, there are shown schematic diagrams illustrating the digital control section according to the invention. The first portion of the digital control section is illustrated in the schematic diagram of FIG. 1b with the remaining portion thereof shown in FIG. 1c.

The collector currents $\frac{3}{4}I_1$ of transistor 58 and $\frac{1}{4}I_1$ of transistor 60 are progressively divided in successive stages of the illustrated digital control section according to a binary input signal that is applied to nine binary control inputs, shown as G8, G7, G6, G5, G4, G3, G2, G1 and G0. The binary input signal comprises a binary word including nine bits corresponding to the nine control inputs G8–G0. The binary input signal is related to a desired logarithmic attenuation according to a predetermined rule, as illustrated immediately below.

Each of the nine bits is provided as either a logic 0 or a logic 1. In the illustrated embodiment, a logic 0 input bit provides zero dB reduction in gain and a logic 1 input bit provides a predetermined attenuation according to the significance of the bit. The most significant bit (MSB) is applied to the G8 binary control input and the least significant bit is applied to the G0 binary control input. For example, the predetermined attenuation corresponding to each of the nine input bits may be as shown in the following table, where Y represents a predetermined attenuation.

| Control Input | Significance of Bit | Relative Attenuation Provided by a 1 Input | Example Attenuation in dB provided by a 1 input where Y = 48 db |
|---|---|---|---|
| G8 | MSB | Y | 48 |
| G7 | MSB-1 | $Y/2^1$ | 48/2 = 24 |
| G6 | MSB-2 | $Y/2^2$ | 48/4 = 12 |
| G5 | MSB-3 | $Y/2^3$ | 48/8 = 6 |
| G4 | MSB-4 | $Y/2^4$ | 48/16 = 3 |
| G3 | MSB-5 | $Y/2^5$ | 48/32 = 1.5 |
| G2 | MSB-6 | $Y/2^6$ | 48/64 = ¾ |
| G1 | MSB-7 | $Y/2^7$ | 48/128 = ⅜ |
| G0 | MSB-8 | $Y/2^8$ | 48/256 = 3/16 |

For the example given, the maximum attenuation is obtained with a 1 input bit applied to all of the control inputs G8-G0 and is equal to the sum of attenuations in dB or approximately 95.8 dB. Thus, a total dynamic range of 95.8 dB is provided in approximately 0.2 dB steps with the nine control inputs.

The foregoing rule or relationship between the binary input signal and the attenuation provided can be expressed as follows for a nine stage digital control section:

$$B_t = B_8 \cdot A_8 + B_7 \cdot A_7 + \ldots + B_0 \cdot A_0 \quad (1)$$

where $B_t$ = total desired attenuation in d.b.;

$B_0-B_8$ identify the available attenuation for each stage 0-8; and $A_0-A_8$ identify the bits (logic 1 or logic 0) of the binary input signal for stages 0-8, respectively; and $$B_n = \frac{\text{maximum available attenuation of the } n\text{th stage of the digital control section}}{2^{9-n}} \quad (2)$$

where n = 0 through 8 and $B_n$ is the available attenuation for stage n.

In the digital control section, each bit of the binary input signal is applied via the corresponding one of the control inputs G8-G0 to the base of an NPN control transistor (such as transistor 94) which has a collector coupled to $+V_{supply}$ and an emitter which is coupled to an NPN transistor current divider circuit, as shown. Thus, with a logic 0 or low voltage input, the base of the control transistor is clamped to ground and the control transistor is thereby cut-off or rendered nonconductive. Alternatively, when the binary control input is a logic 1 or a logic high voltage, the base emitter junction of the control transistor is forward biased, thereby rendering the control transistor turned-on or conductive. As will be shown, when the control transistor of a particular stage is turned on, that stage provides attenuation, but when the control transistor is turned off, no attenuation is provided by that stage.

Referring now to the left portion of FIG. 1b, there is shown the first part of the digital control section including the control input G8 to which the MSB is applied. The collector currents $\frac{3}{4}I_1$ of transistor 58 and $\frac{1}{4}I_1$ of transistor 60 are divided according to the control bit that is applied to the G8 control input as follows.

The first NPN transistor current divider circuit comprising a plurality of switches, NPN transistors 72-92, is coupled to a control transistor 94 and is arranged to provide an output current of $1/256\ I_1$ with a 1 applied to the control input G8. The output current $1/256\ I_1$ corresponds to approximately 48 dB reduction in gain.

The emitter of each of the transistors 72-92 is provided with a predetermined relative junction area in order to determine the emitter current of the same. For example, transistor 74 is provided with three times the emitter junction area (3×) as the emitter junction area (1×) of the transistor 76. The sum of the emitter current of transistors 74, 76 equals the collector current of transistor 60 ($\frac{1}{4}I_1$). Thus, the emitter current of transistor 74 equals ¾ of $\frac{1}{4}I_1 = 3/16\ I_1$ and the emitter current of transistor 76 equals ¼ of $\frac{1}{4}I_1 = 1/16\ I_1$, as determined by the relative emitter junction area of the transistors 74, 76.

The emitter of transistor 72 is coupled to the collector of the transistor 58, so that the emitter current of transistor 72 equals the collector current, $\frac{3}{4}I_1$, of transistor 58. The collector of transistor 72 is coupled to both the collector of transistor 74 and to the emitter of transistor 78, so that the emitter current of transistor 78 equals the sum of the collector currents of the transistors 72, 74. Thus, the emitter current of transistor 78 equals $\frac{3}{4}I_1 + 3/16\ I_1$ or $15/16\ I_1$.

The collector of transistor 82 is coupled to both the emitter of transistor 86, shown as having an emitter junction area of 3×, and to the emitter of transistor 88, shown as having an emitter junction area of 1×. The emitter (1×) of transistor 82 is coupled to both the emitter (3×) of transistor 80 and to the collector of transistor 76, so that the sum of the emitter currents of transistors 80, 82 equals the collector current of transistor 76 which equals $1/16\ I_1$. Accordingly, the emitter current of the transistor 80 equals ¾ of $1/16\ I_1 = 3/64\ I_1$ and the emitter current of the transistor 82 equals ¼ of $1/16\ I_1 = 1/64\ I_1$. Likewise, the sum of the emitter currents 86, 88 equals the collector current of the transistor 82 which equals $1/64\ I_1$. As determined by the relative emitter junction area of transistors 86, 88, the emitter current of the transistor 86 is ¾ of $1/64\ I_1 = 3/256\ I_1$ and the emitter current of the transistor 88 is ¼ of $1/64\ I_1 = 1/256\ I_1$. The collector of the transistor 88 is coupled to the emitter of the transistor 90 so that the emitter current of transistor 90 is also equal to $1/256\ I_1$.

The collector of transistor 78 is coupled to both the collector of transistor 80 and to the emitter of transistor 84. Accordingly, the emitter current of transistor 84 equals the sum of the collector currents of the transistors 78, 80 which equals $15/16\ I_1 + 3/64\ I_1 = 63/64\ I_1$. The collector of transistor 84 is coupled to the collector of transistor 86 and to the emitters of transistors 92 and 94. The sum of the emitter currents of transistors 92, 94 equals the sum of the collector currents of transistors 84, 86 which equals $63/64\ I_1 + 3/256\ I_1 = 255/256\ I_1$.

A conventional PNP current mirror including PNP transistors 96, 98, 100 is coupled to the collectors of transistors 90, 92, as shown, to provide an output current $I_{1\ out}$ that is equal to the sum of the collector currents of transistors 90, 92. The current $I_{1\ out}$ is applied to the second stage of the digital control section which includes the binary control input G7.

The magnitude of $I_{1\ out}$ is determined by the control bit that is coupled through the control input G8 to the base of the NPN control transistor 94. For example, with a 0 or low voltage applied to the base of control transistor 94, the base emitter junction of transistor 94 is reverse biased and the control transistor 94 is thereby cut-off or rendered nonconductive. Thus, the emitter current of transistor 92 equals 255/256 $I_1$ with the emitter current of transistor 94 equal to zero as the emitter current of transistor 90 equals 1/256 $I_1$, $I_{1\ out}$ equals 255/256 $I_1$ + 1/256 $I_1$ = 256/256 $I_1$ or $I_1$.

Alternatively, when the binary control input is a 1 or logic high voltage, the base emitter junction of the control transistor 94 is forward biased, thereby rendering the control transistor turned-on or conductive and rendering the transistor 92 non-conductive. Consequently, the collector current of transistor 96 and $I_{1\ out}$ are now equal to 1/256 $I_1$.

Thus, in the first current divider circuit that is coupled to the most significant binary control input, G8, the input current is divided to produce the fixed fraction, 1/256 $I_1$ corresponding to approximately 48 dB reduction in gain for a high binary control input. Alternatively, a low binary control input being applied to the control input G8 provides an $I_{1\ out}$ equal to $I_1$ and a zero db reduction in gain.

The collector of the PNP current mirror transistor 100 is coupled through a diode 102 to the collector of an NPN transistor 104. The anode of diode 102 is coupled to the base of an NPN transistor 106 and the cathode thereof is coupled to the collector of the transistor 104. The collector of transistor 106 is coupled through a diode 107 to the $+V_{supply}$ terminal and the emitter of transistor 106 is coupled to the base of transistor 104. The diode 102 is employed to provide a voltage matching the base emitter voltage of the NPN transistor 106. The base of the NPN transistor 104 additionally is coupled to the base of the transistors 108, 110. The emitters of the transistors 104, 108, 110 are grounded; accordingly, the magnitudes of the base emitter voltages are equal for the transistors 104, 108, 110 and the emitter currents for the same are proportional to the relative emitter junction areas as described hereinbefore.

An NPN transistor current divider circuit comprising a plurality of NPN transistors 108–120 is coupled to a control transistor 122 and is arranged to divide the current $I_{1\ out}$ by the fixed fraction 1/16 with a 1 or a logic high voltage being applied to the control input G7, thereby providing approximately 24 dB reduction in gain. Alternatively, the NPN transistor current divider circuit provides an undivided $I_{1\ out}$ when a 0 or logic low voltage is applied to the control input G7 corresponding to 0 dB reduction in gain. The NPN transistor current divider circuit, configured as shown, is coupled to the control input G7 to provide 1/16 $I_{1\ out}$ or $I_{1\ out}$ as follows.

The emitter of transistor 108 is provided with three times the junction area (3×) as the emitter junction area (1×) of the transistor 110. Accordingly, the emitter current of transistor 108 equals $\frac{3}{4}I_{1\ out}$ and the emitter current of transistor 110 equals $\frac{1}{4}I_{1\ out}$, as determined by the relative emitter junction areas of the transistors 108, 110.

The emitter of transistor 112 is coupled to the collector of transistor 108 and thus conducts an emitter current that is equal to $\frac{3}{4}I_{1\ out}$. The collector of the transistor 110 is coupled to the emitters of both transistors 114, 116. Thus, the sum of the emitter currents of the transistors 114, 116 equals the collector current of the transistor 110 ($\frac{1}{4}I_{1\ out}$). As determined by the relative emitter junction area of transistors 114, 116, the emitter current of transistor 114 equals $\frac{3}{4}$ of $\frac{1}{4}I_{1\ out}$ = 3/16 $I_1$ out and t the emitter current of transistor 116 equals $\frac{1}{4}$ of $\frac{1}{4}I_{1\ out}$ = 1/16 $I_{1\ out}$. The emitter of transistor 120 is coupled to the collector of transistor 116, as shown. Thus, the emitter current of transistor 120 equals the collector current of the transistor 116 or 1/16 $I_{1\ out}$.

The collector of transistor 112 is coupled to the collector of transistor 114 and to the emitters of transistors 118, 122, as shown. The sum of the collector currents of transistor 112, 114 is equal to the sum of the emitter currents of transistors 118, 122. The sum of the collector currents of transistors 112, 114 equals $\frac{3}{4}I_{1\ out}$ + 3/16 $I_{1\ out}$ = 15/16 $I_{1\ out}$.

The base of the control transistor 122 is coupled to the control input G7 with the collector thereof coupled to $+V_{supply}$. A logic 0 or a logic 1 control bit is applied to the control input G7 and is coupled thereby to the base of the NPN control transistor 122. As described hereinabove with respect to the control input G8 that is coupled to the similarly configured control transistor 94, with a logic 0 or low voltage applied to the base of the control transistor 122, the base emitter junction thereof is reverse biased so that the control transistor 122 is cut-off or rendered nonconductive. Thus, with a logic 0 control bit applied to the control input G7, the emitter current of transistor 118 equals 15/16 $I_{1\ out}$ with the emitter current of the control transistor 122 equal to nil. As the current in transistor 120 equals 1/16 $I_{1\ out}$, the total output current of the second stage equals $I_{1\ out}$ when a logic zero is applied to the G7 input.

Alternatively, when a logic 1 control bit is applied to the control input G7, the control transistor 122 is turned-on and shunts the collector currents of transistors 112, 114 (15/16 $I_{1\ out}$) to the $+V_{supply}$. The sum of the collector currents of transistors 118, 120 is now equal to 1/16 $I_{1\ out}$ corresponding to approximately 24 dB reduction in gain for a logic 1 bit being applied to the control input G7. The sum of the collector currents of transistors 118, 120 is shown as $I_{2\ out}$ and is further divided according to the binary control bit that is applied to the binary control input G6 in the third stage of the digital control section.

An NPN transistor current divider circuit comprising a plurality of NPN transistors 124–130 is coupled to a control transistor 132 and is arranged to divide the current $I_{2\ out}$ by the fixed fraction $\frac{1}{4}$ when a logic 1 is applied to the binary control input G6 corresponding to approximately 12 dB reduction in gain. Alternatively, a zero dB reduction in gain is provided when a logic 0 is applied to the binary control input G6.

The NPN transistor current divider circuit configured as shown, provides an output current, shown as $I_{3\ out}$, that is equal to either $I_{2\ out}$ or $\frac{1}{4}I_{2\ out}$ as will now be described.

The sum of the emitter currents of transistors 124, 126 equals the sum of the collector currents of transistors 118, 120 and is shown as $I_{2\ out}$. As determined by the relative emitter junction areas, the emitter current of transistor 124 equals $\frac{3}{4}I_{2\ out}$ and the emitter current of transistor 126 equals $\frac{1}{4}I_{2\ out}$. The emitter current of transistor 130 equals the collector current of transistor 126 ($\frac{1}{4}I_{2\ out}$). The sum of the emitter currents of transisors 128, 132 equals the collector current, $\frac{3}{4}I_{2\ out}$, of transistor 124.

The control transistor 132 is turned-on by a logic 1 being applied to the control input G6 or alternatively is cut-off with a logic 0 being applied to the control input G6. When the input G6 receives a logic 1, the transistor 132 shunts the collector current of transistor 124 to the $+V_{supply}$ and the transistor 128 is rendered nonconductive. Alternatively, the control transistor 132 is turned off when a logic 0 is applied to control input G6, and then the emitter current of transistor 128 equals $\frac{3}{4}I_{2\ out}$. Thus, the sum of the collector currents of transistors 128, 130 equals either $\frac{1}{4}I_{2\ out}$ or $I_{2\ out}$, corresponding respectively, to either a logic 1 or a logic 0 being applied to the control input G6.

A PNP transistor current mirror including a plurality of PNP transistors 134, 136, 138 is coupled to the collector of transistors 128, 130, as shown. The PNP current mirror provides an output current shown as $I_{3\ out}$ that is equal to the sum of the collector currents of transistors 128, 130. The current, $I_{3\ out}$, is applied to the next stage of the digital control section which includes the binary control input G5.

The collector current, $I_{3\ out}$, of transistor 138 is coupled through a diode 140 to the collector of an NPN transistor 142. The anode of diode 140 is coupled to the base of the transistor 144 and the cathode thereof is coupled to the collector of transistor 142, as shown. The collector of transistor 144 is coupled through the diode 107 to $+V_{supply}$ and the emitter of transistor 144 is coupled to the base of the transistor 142. The diode 140 provides a voltage matching the base emitter voltage of the NPN transistor 144. The base of the transistor 142 additionally is coupled to the base of transistors 146, 148. The emitters of the transistors 142, 146, 148 are grounded, so that the base-emitter voltages are equal for the transistors 142, 146, 148, and the emitter currents for the same are proportional to the relative emitter junction areas, as described hereinbefore.

An NPN transistor current divider circuit comprising the transistors 146-152 is coupled to a control transistor 154 and is arranged to divide the current $I_{3\ out}$ by the fixed fraction $\frac{1}{2}$ when a logic 1 or a high voltage is applied to the control input G5, thereby providing approximately 6 dB reduction in gain. Alternatively, the NPN transistor current divider circuit provides an undivided $I_{3\ out}$ when a logic 0 or a low voltage is applied to the control input G5, which corresponds to a zero dB reduction in gain.

The transistors 146, 148 are provided with equal emitter junction areas so that the emitter current of each is equal to $\frac{1}{2}I_{3\ out}$. The emitter of transistor 152 is coupled to the collector of the transistor 148 and thus conducts an emitter current which is also equal to $\frac{1}{2}I_{3\ out}$. The emitter of transistor 150 is coupled to the emitter of the control transistor 154 and to the collector of the transistor 146. Thus, the sum of the emitter currents of transistors 150, 154 is equal to the collector current, $\frac{1}{2}I_{3\ out}$, of transistor 146. The collector of transistor 150 is coupled to the collector of transistor 152. Accordingly, the sum of the collector currents of transistors 150, 152, shown as $I_{4\ out}$, equals $\frac{1}{2}I_{3\ out}+\frac{1}{2}I_{3\ out}$ or $I_{3\ out}$ when a logic 0 is applied to the control input G5 to turn off the control transistor 154. Alternatively, $I_{4\ out}$ equals $\frac{1}{2}I_{3\ out}$, the collector current of transistor 152, when a logic 1 control bit is applied to the control input G5 to turn on the control transistor 154 and to turn off the transistor 150.

The current $I_{4\ out}$ is further divided according to the control bit that is applied to the control input G4 in the next stage of the digital control section. An NPN transistor current divider circuit comprising the transistors 156-162 is coupled to a control transistor 164 and is arranged to divide the current, $I_{4\ out}$ by the fixed fraction 5/7 for a logic 1 or high voltage being applied to the control input G4, thereby providing approximately 3 dB reduction in gain. Alternatively, a zero dB reduction in gain is provided by the divider circuit with a logic 0 or low voltage being applied to the control input G4.

The sum of the emitter currents of transistors 156, 158 equals $I_{4\ out}$. The transistors 156, 158 are provided with relative emitter junction areas so that the emitter current of transistor 156 equals 2/7 $I_{4\ out}$ and the emitter current of transistor 158 equals 5/7 $I_{4\ out}$. The collector of transistor 156 is coupled to both the emitter of transistor 160 and to the emitter of the control transistor 164. Thus, with the control transistor 164 rendered nonconductive by a logic 0 being applied to the control input G4, the emitter current of transistor 160 equals 2/7 $I_{4\ out}$ and the total current output of this stage, indicated as $I_{5\ out}$, equals 2/7 $I_{4\ out}$ plus 5/7 $I_{4\ out}$, or an undivided $I_{4\ out}$. Alternatively, with a logic 1 being applied to the control input G4, the control transistor 164 is turned-on to shunt the current from transistor 156 to $+V_{supply}$, and the transistor 160 is rendered nonconductive. Accordingly, the sum of the collector currents of transistors 160, 162, shown as $I_{5\ out}$, now equals 5/7 $I_{out}$.

The current $I_{5\ out}$ is divided according to the control bit that is applied to the binary control input G3 by an NPN transistor divider circuit comprising transistors 166-172. This divider circuit is coupled to a control transistor 174 and is arranged to divide the current $I_{5\ out}$ by the fixed fraction 5/6 when a logic 1 is applied to the control input G3, thereby providing approximately 1.5 dB reduction in gain. Alternatively, the NPN current divider circuit provides an undivided $I_{5\ out}$ when a logic 0 is applied to the control input G3. The latter condition corresponds to a zero dB reduction in gain.

In the divider circuit, configured as shown, the sum of the emitter currents of the transistors 166, 168 equals $I_{5\ out}$. The transistors 166, 168 are provided with relative emitter junction areas so that the emitter current of transistor 166 equals 1/6 $I_{5\ out}$ and the emitter current of transistor 168 equals 5/6 $I_{5\ out}$.

The collector of transistor 166 is coupled to the emitters of both transistors 170, 174. Thus, the emitter current of transistor 170 equals 1/6 $I_{5\ out}$ when a logic 0 is applied to the control input G3 and the control transistor 174 is thereby rendered nonconductive. Alternatively, the emitter current of transistor 170 equals zero when a logic 1 is applied to the control input G3 and the control transistor 174 is thereby turned-on. Accordingly, the sum of the collector currents of the transistors 170, 172 equals either $I_{5\ out}$ or 5/6 $I_{5\ out}$, corresponding to a logic 0 or a logic 1 being applied to the control input G3.

A PNP transistor current mirror comprising transistors 176, 178, 180 is coupled to the collectors of transistors 170, 172, as shown. The PNP current mirror provides an output current shown as $I_{6\ out}$ that is equal to the sum of the collector currents of transistors 170, 172.

The current $I_{6\ out}$ is applied to the next stage of the digital control section which includes the binary control input G2. Toward this end, the collector of the current mirror transistor 180 is coupled through a diode 182 to the collector of the NPN transistor 184. The anode of diode 182 is coupled to the base of a transistor 186, shown in FIG. 1c, and the cathode thereof is coupled to the collector of transistor 184. The collector of transistor (186) is coupled through the diode 107 to $+V_{supply}$, and the emitter of transistor (186) is coupled to the base of transistor 184. The base of transistor 184 additionally is coupled to the bases of transistors 188, 190 that are shown in FIG. 1c.

Referring now to FIG. 1c, there is shown a schematic diagram of the remaining stages of the digital control section. An NPN transistor current divider circuit comprising transistors 188–200 is coupled to a control transistor 202 and is arranged to divide the current $I_{6\ out}$ by the fixed fraction 11/12 when a logic 1 is applied to the control input G2, thereby providing approximately $\frac{3}{4}$ dB reduction in gain. Alternatively, this NPN transistor current divider circuit provides a zero dB reduction in gain when a logic 0 is applied to the control input G2. The NPN transistor current divider, configured as shown, provides either $11/12\ I_{6\ out}$ or an undivided $I_{6\ out}$ as follows.

The emitter current of transistor 188 equals $1/6\ I_{6\ out}$ and the emitter current of transistor 190 equals $5/6\ I_{6\ out}$ as determined by the relative junction emitter areas of the same. The emitter current of transistor 196 equals the collector current of transistor 190 ($5/6\ I_{6\ out}$). The sum of the emitter currents of transistors 192, 194 equals the collector current of transistor 188 ($1/6\ I_{6\ out}$) and as both transistors conduct equally, they each conduct an emitter current equal to $1/12\ I_{6\ out}$.

The collector of transistor 194 is coupled to the collector of transistor 196 and to the emitter of transistor 200. Thus, the emitter current of transistor 200 equals $11/12\ I_{6\ out}$. The sum of the emitter currents of the control transistor 202 and the transistor 198 equals the collector current of transistor 192, $1/12\ I_{6\ out}$. Thus, when a logic 0 is applied to the control input G2, the control transistor 202 is rendered nonconductive so that the emitter current of transistor 198 equals $1/12\ I_{6\ out}$ and the total output current ($I_{7\ out}$) for this stage equals $12/12\ I_{6\ out}$. Alternatively, with a logic 1 applied to the control input G2, the control transistor 202 is turned-on to shunt $1/12\ I_{6\ out}$ to the $+V_{supply}$. Accordingly, the sum of the collector current of transistors 198, 200 ($I_{7\ out}$) equals $11/12\ I_{6\ out}$ when a logic 0 is applied to the G2 input. This corresponds to a gain reduction of about $\frac{3}{4}$ db.

The current $I_{7\ out}$ is fed to the next stage where it is divided according to the control bits being applied to the control inputs G1 and G0. An NPN transistor current divider circuit comprising transistors 204–220 is coupled to the control transistor 222 and is arranged to divide the current $I_{7\ out}$ by the fixed fraction 23/24 when a logic 1 is applied to the control input G1, thereby providing approximately 3/8 dB reduction in gain. Alternatively, the NPN transistor divider circuit provides a zero dB reduction in gain corresponding to a logic 0 being applied to the control input G1.

The same NPN transistor current divider circuit (transistors 204–220) is coupled to the control input G0 to divide the current $I_{7\ out}$ by the fixed fraction 47/48 corresponding to approximately 3/16 dB reduction in gain when a logic 1 is applied to the control input G0. Alternatively, a zero dB reduction in gain occurs when a logic 0 is applied to the control input G0 as will now be described.

The sum of the emitter currents of transistors 204, 206 equals $I_{7\ out}$. In accordance with the relative emitter junction areas of transistors 204, 206, the respective emitter current of the same is $1/6\ I_{7\ out}$ and $5/6\ I_{7\ out}$. The sum of the emitter currents of transistors 208, 210, 212 equals the collector current of transistor 204 ($1/6\ I_{7\ out}$). Accordingly, the emitter current of transistor 208 equals $2/48\ I_{7\ out}$; the emitter current of transistor 210 equals $1/48\ I_{7\ out}$ and the emitter current of transistor 212 equals $5/48\ I_{7\ out}$. The emitter current of transistor 214 equals the collector current of transistor 206 ($5/6\ I_{7\ out}$). The sum of the emitter current of the control transistor 222 and transistor 216 equals the collector current of transistor 208 which is equal to $2/48\ I_{7\ out}$.

The sum of the emitter currents of the control transistor 224 and transistor 218 is equal to the collector current of transistor 210 which is equal to $1/48\ I_{7\ out}$. The emitter current of transistor 220 equals the collector current of transistors 212, 214 which equals $5/48\ I_{7\ out}+5/6\ I_{7\ out}$ or $45/48\ I_{7\ out}$.

The collector current of a transistor 226 in a PNP current mirror equals the sum of the collector currents of transistors 216, 218, 220. The PNP current mirror additionally includes PNP transistors 228, 230, configured as shown, so that the collector current of transistor 230 is the mirror of the collector current of transistor 226.

A logic 0 or logic 1 control bit is applied to the control input G1 and is coupled thereby to the base of the NPN control transistor 222. When a logic 0 is applied to the base of the control transistor 222, the base emitter junction thereof is reverse biased, thereby rendering the control transistor 222 nonconductive, whereby the emitter current of transistor 216 equals the collector current of transistor 208 or $2/48\ I_{7\ out}$. With a logic 0 control bit applied to the binary control input G0, the control transistor 224 is rendered nonconductive so that the emitter current of transistor 218 equals the collector current of transistor 210 or $1/48\ I_{7\ out}$. Accordingly, the collector currents of the PNP current mirror transistors 226, 230 equal $I_{7\ out}$ when a logic 0 is applied to both the control inputs G1, G0 which corresponds to a zero dB reduction in gain.

Alternatively, when a logic 1 control bit is applied to the control input G1 the control transistor 222 is turned-on and the transistor 216 is rendered nonconductive. This reduces the output current in the transistor 230 by 1/24th, corresponding to a reduction in gain of 3/8 db. When a logic 1 is applied to the control input G0, the control transistor 224 is turned-on and the transistor 218 is rendered nonconductive. This reduces the output current in the transistor 230 by 1/48th, corresponding to a reduction in gain of 3/16 db. Accordingly, with a logic 1 applied to the control input G1 and a logic 0 applied to the control input G0, the collector current of transistor 230 equals $23/24\ I_{7\ out}$, and when a logic 1 is applied to the control input G0 and a logic 0 is applied to the control input G1, the collector current of transistor 230 equals $47/48\ I_{7\ out}$.

A resistor 236 and a plurality of diodes 238–248 are coupled in series between $+V_{supply}$ and ground, as shown, to provide a bias potential to the base of each of the NPN transistors included in the hereinbefore described current divider circuits as will now be described.

The resistor 236 is coupled to $+V_{supply}$ and the anode of diode 238. The anode of diode 238 additionally is coupled to the bases of transistors 170, 172, 216–220 with the cathode of diode 238 coupled to the anode of diode 240 and to the bases of transistors 92, 90, 128, 130, 166, 168, 208–214. The cathode of diode 240 is coupled to the anode of diode 242 and to the bases of transistors 84–88, 124, 126, 160, 162, 204, 206. The cathode of the diode 242 is coupled to the anode of diode 244 and to the bases of transistors 78–82, 118, 120, 156, 158, 198, 200. The cathode of the diode 244 is coupled to the anode of diode 246 and to the bases of transistors 72–76, 112–116, 150, 152, 192–196. The cathode of the diode 246 is coupled to the anode of diode 248, with the cathode of diode 248 coupled to ground.

In summary, in the digital control section a total dynamic range of approximately 95.8 dB is provided in steps equal to approximately 0.2 dB by employing nine control bits that are applied to the nine control inputs G8–G0. This is preferably achieved by progressively dividing the current $I_1$ supplied by the transistors 58 and 60 (FIG. 1b) in accordance with the binary input bits which control the division (or lack thereof) which occurs in the various stages of the digital control section. Consequently, the output current of the digital control section (from transistor 230) equals a predetermined fraction of the input current $I_1$ and corresponds to a selected logarithmic attenuation according to the binary input signal.

The collector of transistor 230 is coupled through a resistor 249 to the anode of diode 250. The cathode of the diode 250 is coupled to the collector of a transistor 251. The anode of the diode 250 additionally is coupled to the base of a transistor 252 with the emitter of transistor 252 coupled to the base of transistor 251. The diode 250 is employed to provide a voltage matching the base emitter voltage of the NPN transistor 252. The collector of the transistor 252 is coupled through the diode 107 (FIG. 1b) to $+V_{supply}$. The emitter of transistor 251 is coupled to ground and the base thereof additionally is coupled to the base of transistor 253. The emitter of transistor 253 is coupled to ground, as shown. With this arrangement, the collector current of transistor 253 corresponds to the progressively divided input current $I_1$ according to the nine binary control bits applied to the control input G8–G0.

Figure 1D:
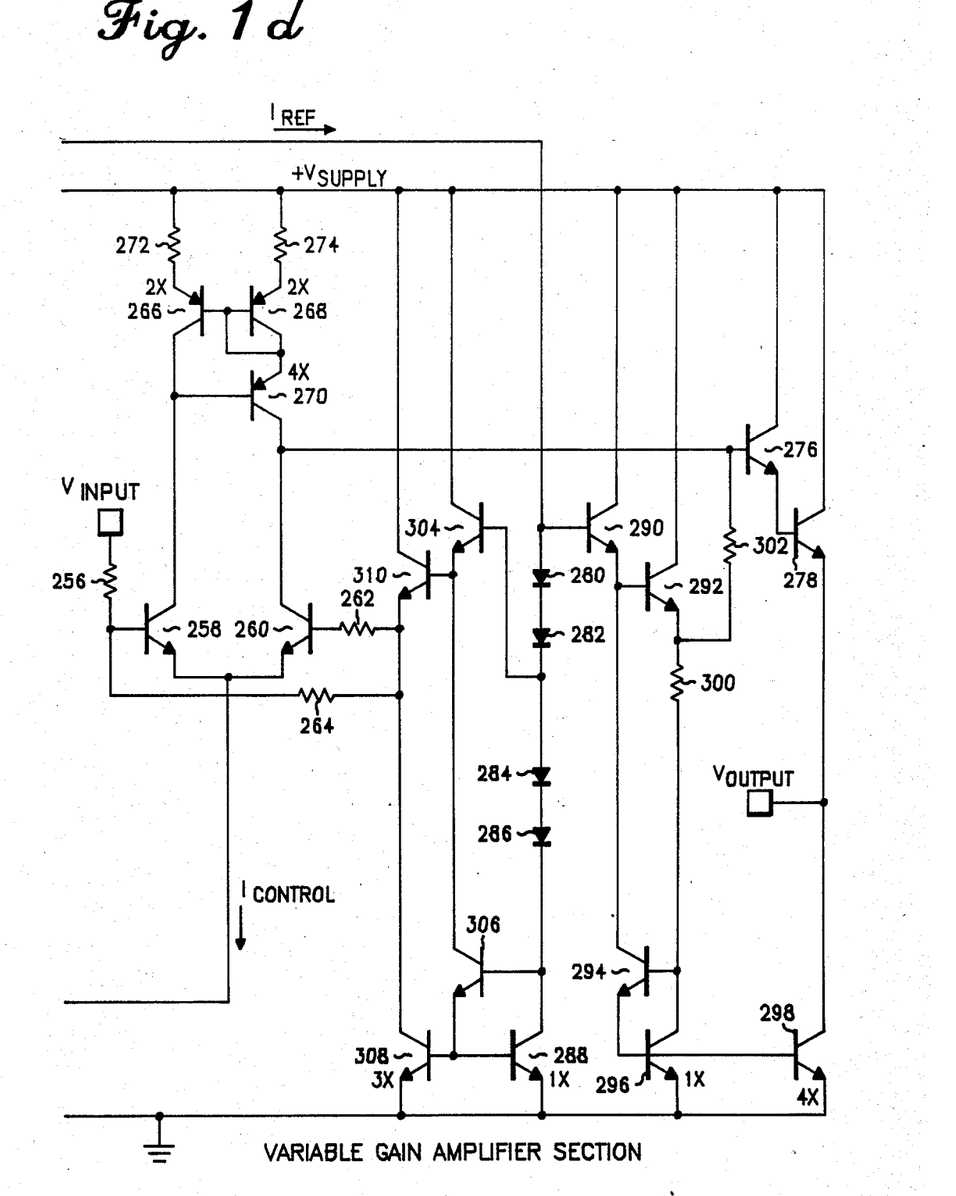
FIG. 1d is a schematic diagram of a variable gain amplifier of the novel logarithmic, digitally variable gain controlled amplifier.

Referring now to FIG. 1d, there is shown a schematic diagram of a variable gain amplifier section of the logarithmic, digitally variable gain controlled amplifier according to the invention. The variable gain amplifier section is constructed in accordance with conventional integrated circuit techniques in order to provide an amplifier having a gain which is proportional to a control current being applied to a control input.

A control current, shown as $I_{control}$ determines the gain of the variable gain amplifier section. $I_{control}$ is equal to the collector current of transistor 253 which is shown in FIG. 1c. Accordingly, the gain of the variable gain amplifier section is determined by the binary control word applied to the binary control inputs G8–G0.

One should recall that the current $I_{control}$ is derived from the current $I_B$ (FIG. 1A) and that $I_B$ varies as a function of temperature. $I_{control}$ exhibits the same temperature dependence and is selected to cancel the temperature dependence associated with the variable gain amplifier, thereby to produce an amplified (or attenuated) output which is substantially independent of temperature.

An input signal, $V_{input}$, is applied to the variable gain amplifier via a resistor 256 which is coupled to the base of an NPN transistor 258. The emitter of transistor 258 is coupled to the emitter of transistor 260 and the base of transistor 260 is coupled through resistors 262, 264 to the base of transistor 258, as shown. The transistors 258, 260 are configured to form a conventional differential pair.

The collectors of transistor 258, 260 are coupled to a PNP current mirror which includes transistors 266, 268 and 270 and resistors 272, 274. The output of this current mirror and the collector of transistor 260 are coupled to a load resistor 302 and to the base of an NPN transistor 276. The emitter of the transistor 276 is coupled to the base of an NPN transistor 278 with the collectors of both transistors 276, 278 coupled to $+V_{supply}$ to form a conventional unity gain follower which supplies the gain controlled output signal at the terminal labeled $V_{output}$.

To establish bias voltages for the differential amplifier and for the unity gain follower (276,278), a string of diodes 280, 282, 284, and 286 is included and coupled to transistors 288 and 306 as shown. Operating current for these diodes is conveniently supplied by the current $I_{REF}$ (from FIG. 1A).

To bias the differential amplifier, an emitter follower comprising transistors 304 and 310 is coupled as shown between the junction of diodes 282 and 284 and the junction of resistors 262 and 264. The emitter of transistor 310 is coupled to the collector of a transistor 308 which operates in cooperation with the transistor 288 as a current mirror to supply current to the transistor 310. With this arrangement, transistors 258 and 260 receive an appropriate base bias and the junction of transistors 262, 264 is held at a low impedance level to provide an AC ground at that point and to provide signal isolation between the input and the output of the amplifier section.

In a similar manner, the transistors 276 and 278 receive a base bias via the illustrated connection of transistors 290, 292 between the anode of the diode 280 and the load resistor 302. Transistors 296 and 298 form a current mirror to supply emitter current to the transistor 278.

With the foregoing arrangement, the variable gain amplifier section provides an amplifier having a signal input, $V_{input}$, a control input and a signal output, $V_{output}$, and having a gain proportional to a control current, $I_{control}$, received at the control input. The input signal, $V_{input}$, is amplified by the differential pair transistors 258, 260 and the amplified signal is applied to the output terminal via the unity gain follower comprising transistors 276, 278.

The variable gain amplifier which has been described has several advantages, including the ability to provide a wide range of attenuation with a relatively small number of input bits. In the preferred embodiment, a total dynamic range of about 96 db is provided in 0.2 db steps using only 9 input bits. To perform this same function with a conventional linear attenuator would normally require 16 bits.

Further, the illustrated amplifier is designed for fabrication in integrated circuit form to provide a relatively low cost and high quality amplifier for applications such as volume controls and the like. Of course, construction in integrated circuit form is not a necessary aspect of the invention, and those skilled in the art will readily understand that other manufacturing processes may be employed. Many other changes and alterations may obviously be made by those skilled in the art without departing from the invention. Accordingly, it is intended that all such changes and alterations be considered as with the spirit and scope of the invention as defined by the appended claims.

I claim:

1. An integratable, gain controlled amplifier circuit receiving a binary input signal, said amplifier circuit comprising:
    an amplifier having a signal input, a control input and an output and having a gain which is proportional to a control current being applied to said control input;
    a current generator for providing a first current;
    control means receiving the first current and responsive to the binary input signal for dividing the first current to produce a control current equalling a predetermined fraction of said first current such that the binary input signal corresponds to a predetermined logarithmic attenuation of the control current; and
    means for applying said control current to said amplifier's control input to thereby provide a predetermined logarithmic attenuation in the amplifier.

2. An integratable, gain controlled amplifier circuit as claimed in claim 1 wherein all elements are fabricated in a monolithic, bipolar integrated circuit.

3. An integratable, gain controlled amplifier circuit as claimed in claim 1 wherein said control means for dividing said first current comprise a plurality of bipolar switch means being cooperatively arranged to provide attenuation in predetermined, logarithmic steps according to the binary input signal.

4. An integratable, gain controlled amplifier circuit as claimed in claim 1 wherein said control means for dividing said first current comprise a plurality of bipolar switch means being cooperatively arranged to progressively divide the first current according to the binary input signal.

5. An integratable, gain controlled amplifier circuit receiving a binary input signal, said amplifier circuit comprising:
    an amplifier having a signal input, a control input and an output and having a gain which is proportional to a control current being applied to said control input;
    a current generator for providing a first current;
    control means comprising a plurality of bipolar switch means being cooperatively arranged and coupled to said current generator for progressively dividing said first current according to the binary input signal to produce a control current equalling a predetermined fraction of said first current such that the binary input signal corresponds to a predetermined logarithmic attenuation; and
    means for applying said control current to said amplifier's control input to thereby provide a predetermined logarithmic attenuation in said amplifier.

6. A gain controlled amplifier circuit comprising:
    an amplifier having a signal input, a control input and an output and having a gain which is proportional to a current received at the control input;
    means providing a first current;
    a first current dividing stage receiving the first current and receiving a binary input signal for producing an output current which is a predetermined fraction of said first current in response to a first logic level of the binary input signal, and for producing an output current which is substantially equal to the first current in response to a second logic level of the binary input signal;
    a plurality of further current dividing stages serially coupled to the first stage, each stage receiving the output current from a preceding stage and each receiving its own binary input signal for providing an output current which is a predetermined fraction of the current received from a preceding stage in response to a first logic level of its binary input signal, and for providing an output current which is substantially equal to the current received from the preceding stage in response to its binary input signal having a different logic level; and
    means for applying the output current from the last stage to the control input of said amplifier to provide a selected amount of attenuation therein.

7. A method of providing logarithmic, digitally variable gain control in an integratable gain controlled amplifier circuit that has a gain proportional to a control current being applied to a control input thereof, said method comprising:
    a. providing a binary input signal related to a predetermined logarithmic attenuation;
    b. providing a biasing current;
    c. sequentially dividing said biasing current by a series of preselected fractions according to said binary input signal to produce a control current equalling a predetermined fraction of said biasing current; and
    d. applying said control current to the control input of the variable gain controlled amplifier circuit.

* * * * *